(12) United States Patent
Huang et al.

(10) Patent No.: US 10,720,442 B2
(45) Date of Patent: Jul. 21, 2020

(54) TUNNELING FIELD EFFECT TRANSISTOR 3D NAND DATA CELL STRUCTURE AND METHOD FOR FORMING THE SAME

(71) Applicant: Yangtze Memory Technologies Co., Ltd., Wuhan, Hubei (CN)

(72) Inventors: Xin Yun Huang, Hubei (CN); Qi Wang, Hubei (CN); Xiang Fu, Hubei (CN); Zhiliang Xia, Hubei (CN); Huang Peng Zhang, Hubei (CN); Hua Min Cao, Hubei (CN)

(73) Assignee: Yangtze Memory Technologies Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/046,730

(22) Filed: Jul. 26, 2018

(65) Prior Publication Data
US 2019/0081068 A1    Mar. 14, 2019

Related U.S. Application Data

(63) Continuation of application No. PCT/CN2018/088265, filed on May 24, 2018.

(30) Foreign Application Priority Data

Aug. 31, 2017    (CN) .......................... 2017 1 0772503

(51) Int. Cl.
*H01L 27/11582*    (2017.01)
*H01L 21/762*    (2006.01)
(Continued)

(52) U.S. Cl.
CPC ...... *H01L 27/11582* (2013.01); *H01L 21/762* (2013.01); *H01L 27/1157* (2013.01);
(Continued)

(58) Field of Classification Search
None
See application file for complete search history.

(56) References Cited

U.S. PATENT DOCUMENTS 9,093,369 B2    7/2015    Shin et al.
9,666,281 B2 *   5/2017    Sakakibara ........ G11C 16/0483
(Continued)

FOREIGN PATENT DOCUMENTS

CN    103490008 A    1/2014
CN    104766865 A    7/2015
(Continued)

OTHER PUBLICATIONS

Edinger, S. "Highly transparent and conducive indium-doped zinc oxide films deposited at low substrate temperature by spray pyrolysis from water based solutions" J. Mater. Sci. 58 Apr. 2017 pp. 8591-8602 (Year: 2017).*
(Continued)

*Primary Examiner* — Grant S Withers
(74) *Attorney, Agent, or Firm* — Sterne, Kessler, Goldstein & Fox P.L.L.C.

(57) ABSTRACT

Methods and structures of a three-dimensional memory device are disclosed. In an example, the memory device includes a plurality vertical memory strings disposed through an alternating conductor/dielectric stack. Each of the memory strings includes a composite dielectric layers and a TFET semiconductor layer. The TFET semiconductor layer includes an n-type semiconductor layer and a p-type semiconductor layer.

20 Claims, 5 Drawing Sheets

(51) Int. Cl.
*H01L 27/1157* (2017.01)
*H01L 27/11565* (2017.01)
*H01L 29/739* (2006.01)
*H01L 29/792* (2006.01)
*H01L 21/28* (2006.01)

(52) U.S. Cl.
CPC .. *H01L 27/11565* (2013.01); *H01L 29/40117* (2019.08); *H01L 29/7391* (2013.01); *H01L 29/7926* (2013.01)

(56) References Cited

U.S. PATENT DOCUMENTS

| | | |
|---|---|---|
| 9,748,266 B1* | 8/2017 | Baraskar ............ H01L 27/11582 |
| 2014/0353738 A1 | 12/2014 | Makala et al. |
| 2015/0104916 A1 | 4/2015 | Lee et al. |
| 2015/0132915 A1* | 5/2015 | Park .................. H01L 29/66833 438/287 |
| 2015/0194435 A1 | 7/2015 | Lee |
| 2016/0343728 A1 | 11/2016 | Song |
| 2017/0040416 A1* | 2/2017 | Ota ..................... H01L 29/1037 |
| 2017/0062456 A1 | 3/2017 | Sugino et al. |
| 2017/0062468 A1* | 3/2017 | Son ..................... H01L 27/1157 |
| 2017/0110470 A1* | 4/2017 | Rabkin ............. H01L 27/11582 |
| 2017/0125430 A1 | 5/2017 | Nishikawa et al. |
| 2017/0243883 A1 | 8/2017 | Kobayashi et al. |
| 2017/0263623 A1* | 9/2017 | Zhang .................. H01L 29/167 |
| 2019/0081068 A1 | 3/2019 | Huang et al. |

FOREIGN PATENT DOCUMENTS

| | | |
|---|---|---|
| CN | 105940492 A | 9/2016 |
| CN | 107527919 A | 12/2017 |
| WO | WO-2017/091338 A1 | 6/2017 |

OTHER PUBLICATIONS

International Search Report and Written Opinion of the International Searching Authority directed to related International Patent Application No. PCT/CN2018/088265, dated Aug. 22, 2018; 8 pages.

* cited by examiner

TUNNELING FIELD EFFECT TRANSISTOR 3D NAND DATA CELL STRUCTURE AND METHOD FOR FORMING THE SAME

CROSS-REFERENCE TO RELATED APPLICATIONS

This application claims the priority of Chinese Patent Application No. 201710772503.4 filed on Aug. 31, 2017 and PCT Application No. PCT/CN2018/088265 filed on May 24, 2018, the entire content of which is incorporated herein by reference.

BACKGROUND

Embodiments of the present disclosure relate to three-dimensional (3D) memory devices and fabrication methods.

Flash memory devices have undergone rapid development. Flash memory devices can store data for a considerably long time without powering, and provide benefits such as high integration level, fast access, easy erasing, and rewriting. To further improve bit density and reduce cost of flash memory devices, 3D NAND memory devices have been developed to address the density limitation in planar memory cells.

A 3D NAND memory device can include a memory array and peripheral devices for controlling signals to and from the memory array. A 3D NAND memory device includes a stack of horizontal word lines arranged over a substrate, with a plurality of vertical memory strings formed through and intersecting the word lines into the substrate. Each memory string can include a vertical semiconductor channel, a tunnel oxide layer and a charge-trapping layer where the charge-trapping layer can trap or de-trap charges from the semiconductor channel or the word line. The intersection of a word line and a memory string forms a memory cell. For example, 32 word lines intersect a memory string and forms 32 memory cells, in series, along the memory string.

Each of the memory cells is operated by applying a voltage bias at the intersecting word line. During operations of a 3D NAND memory device, frequently applying bias voltage at the word line can disturb charge trapping in the charge-trapping layer. Consequently, threshold voltages of memory cells can be subject to undesirable disturbance which degrades reliability of 3D NAND memory devices.

BRIEF SUMMARY

Embodiments of 3D NAND memory device and fabrication methods are described in the present disclosure. The disclosed structures and methods provide numerous benefits including, but not limiting to, reduced disturbance of memory cell threshold voltages during operations of the 3D NAND memory device.

In some embodiments, a 3D NAND memory device includes a substrate having an alternating conductor/dielectric stack, where the alternating conductor/dielectric stack is embed a plurality of 3D NAND memory strings. The 3D NAND memory strings extend vertically and are perpendicular to a top surface of the substrate. Each of the conductor layers in the alternating conductor/dielectric stack can be a word line of the 3D NAND memory device. The intersection of a word line and a 3D NAND memory string forms a 3D NAND memory cell.

In some embodiments, a plurality of 3D NAND memory cells are formed along a 3D NAND memory string.

In some embodiments, a 3D NAND memory string extends vertically above the substrate through the alternating conductor/dielectric stack.

In some embodiments, a 3D NAND memory string includes an inner semiconductor channel and an outer dielectric layer stack.

In some embodiments, a 3D NAND memory cell includes a semiconductor channel surrounded by a plurality of dielectric layers. The semiconductor channel extends substantially perpendicular to a top surface of the substrate. The plurality of dielectric layers includes a tunnel layer, a charge-trapping layer, and a blocking layer.

In some embodiments, a 3D NAND memory cell includes a semiconductor channel which includes an n-type semiconductor layer and a p-type semiconductor layer.

In some embodiments, a 3D NAND memory cell includes a ring-shaped p-type semiconductor layer surrounded by an n-type semiconductor layer, and the n-type semiconductor layer is surrounded by a plurality of dielectric layers.

In some embodiments, a 3D NAND memory cell includes a ring-shaped p-type semiconductor layer surrounded by an n-type semiconductor layer. The n-type semiconductor is surrounded by a tunneling layer. The tunneling layer is surrounded by a charge-trapping layer and the charge-trapping layer is surrounded by a blocking layer. A surface of the blocking layer is in contact with a word line.

In some embodiments, a 3D NAND memory string includes a vertical p-type semiconductor layer on a substrate, a vertical n-type semiconductor layer surrounding a portion of the p-type semiconductor layer and a plurality of vertical dielectric layers surrounding the n-type semiconductor layer. The p-type semiconductor layer is in contact with the substrate. An n-type semiconductor plug is disposed over the n-type semiconductor layer to form a contact of a bit line.

In some embodiments, a 3D NAND memory device includes a substrate having an alternating layer stack of conductor material and insulating material. A plurality of 3D memory strings are vertically embedded in the alternating layer stack. Each of the 3D memory strings includes a p-type semiconductor layer, an n-type semiconductor layer surrounding the p-type semiconductor layer, a tunneling layer surrounding the n-type semiconductor layer, a charge-trapping layer surrounding the tunneling layer, and a blocking layer surrounding the charge-trapping layer. The p-type semiconductor layer is in contact with both the substrate and the n-type semiconductor layer.

In some embodiments, a 3D NAND memory device includes a substrate having an alternating layer stack of conductor material and insulating material. A plurality of 3D memory strings are vertically embedded in the alternating layer stack. Each of the 3D memory strings includes a p-type semiconductor layer, an n-type semiconductor layer surrounding the p-type semiconductor layer, and a plurality of dielectric layers surrounding the n-type semiconductor layer. The alternating layer stack is in contact with the plurality of the dielectric layers. The p-type semiconductor layer is in contact with both the substrate and the n-type semiconductor layer. An n-type semiconductor plug is disposed over the n-type semiconductor layer to form a contact to a bit line.

In some embodiments, a method for forming a 3D NAND memory string includes forming an alternating dielectric stack over a substrate. The method also includes forming a hole through the alternating dielectric stack. The method includes forming a plurality of dielectric layers over sidewalls of the hole followed by forming an n-type semiconductor layer over sidewalls of the plurality of dielectric layers. The method further includes removing a portion of the dielectric layers and the n-type semiconductor layer using an anisotropic etching process. The method also includes forming a p-type semiconductor layer over sidewalls of the n-type semiconductor layer. The p-type semiconductor is in-contact with a portion of a top surface of the substrate.

In some embodiments, a method for forming a 3D NAND memory device includes forming an alternating stack of insulating layers and sacrificial layers over a substrate. The method also includes forming a plurality of holes through the alternating stack of insulating layers and sacrificial layers. Each of the plurality of holes is filled with a plurality of dielectric layers and an n-type semiconductor layer. The method further includes removing a portion of the dielectric layers and the n-type semiconductor layer using an anisotropic etching process. The method also includes forming a p-type semiconductor layer over the n-type semiconductor layer in each of the plurality of holes. The method further includes replacing each of the sacrificial layers with a conducting material.

In some embodiments, forming a plurality of holes includes etching the alternating dielectric stack using a reactive ion etch (RIE) process.

In some embodiments, forming a p-type or an n-type semiconductor layer includes depositing the semiconductor layer using a chemical vapor deposition (CVD) technique, atomic layer deposition technique (ALD), or combinations thereof.

In some embodiments, filling one or more holes with a plurality of dielectric layers includes depositing the dielectric layers using CVD technique, high density plasma (HDP) technique, ALD, or combinations thereof.

In some embodiments, forming one or more holes further includes forming the one or more holes through at least a portion of an alternating dielectric stack.

In some embodiments, forming a 3D NAND memory string includes forming a composite dielectric stack over sidewalls of a hole, which is formed in an alternating dielectric layer stack, and forming a semiconductor stack that fills a remaining portion of the hole.

Channels of 3D NAND memory cells described in the present disclosure can include tunnel field effect transistors (TFET) having an n-type semiconductor layer and a p-type semiconductor layer. Trapped charges in charge-trapping layers of 3D memory cells can be less disturbed due to less frequent applications of voltage bias to the word lines. 3D NAND memory cells incorporating TFET can provide improved threshold voltage stability during 3D NAND memory device operations such as, reading, programming, and erasing. Inhibiting disturbance of trapped charges of 3D memory cells improves reliability of 3D NAND memory devices.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
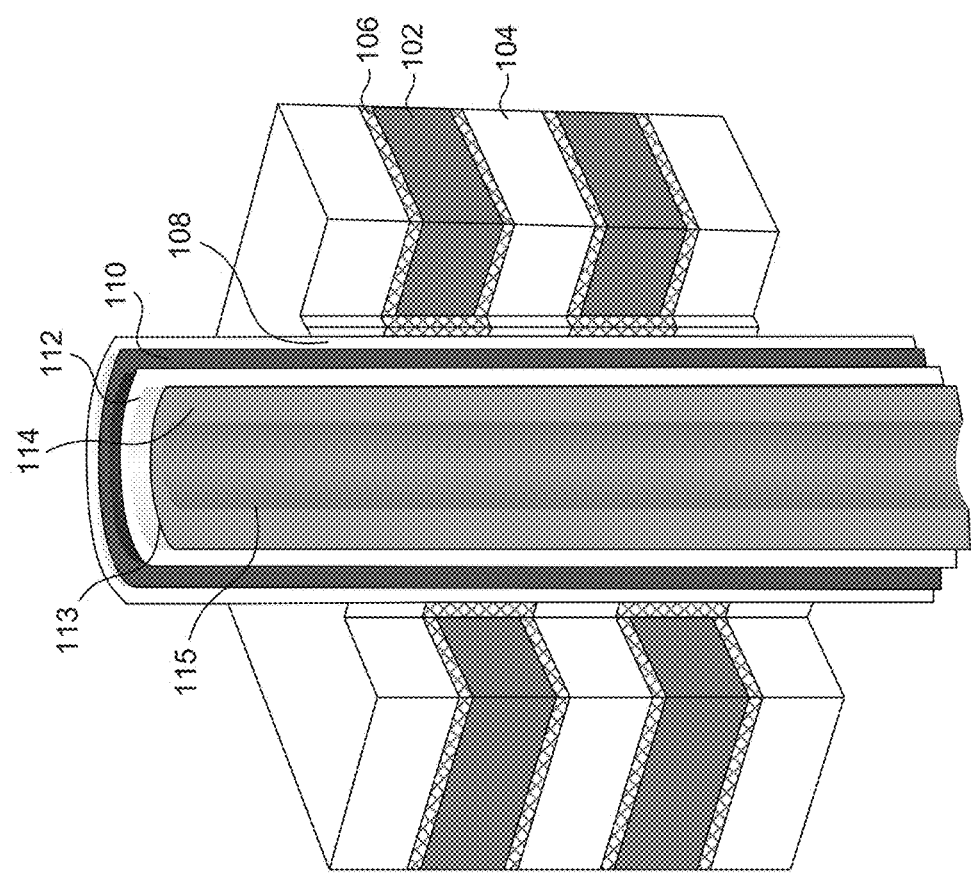
FIG. 1 illustrates a three-dimensional view of a memory device, in accordance with some embodiments of the present disclosure.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate comprises a top surface and a bottom surface. The top surface of the substrate is where a semiconductor device is formed, and therefore the semiconductor device is formed at a top side of the substrate. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "ring-shaped layer" refers to a layer that forms a close loop such that an end of the layer is connected to an other end of the layer. A ring-shaped layer has an inner surface and an outer surface opposite to the inner surface. The inner surface, facing inward of the ring-shaped layer, is separated from the outer surface, facing outward of the ring-shaped layer, by a thickness of the ring-shaped layer.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30%/of the value (e.g., ±10%, ±20%, or ±30% of the value).

As used herein, the term "3D NAND memory device" (referred to herein as "memory device") refers to a semiconductor device with vertically-oriented strings of 3D NAND memory cell transistors (referred to herein as "memory strings," such as NAND strings or 3D NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, the term "horizontal/horizontally" means nominally parallel to the lateral surface of a substrate.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

3D NAND memory device operations can include reading, programming, and erasing. Frequently applying bias voltage at word lines during these operations can disturb charge trapping in charge-trapping layers which in turn causes disturbance errors and degrades memory device reliability.

A so-called "read disturbance error" can occur during a read operation to access data stored a memory cell. During a read operation, a word line of the memory cell in a memory string is supplied with a bias voltage $V_{read}$ to read the ON/OFF status of the memory cell. Other memory cells along the memory string apart from the memory cell are forced to be in the ON state since bias voltage $V_{pass}$ is applied to other word lines. Frequent applications of $V_{pass}$ to memory cells may inject additional charges into charge-trapping layers and cause undesirable positive shift of memory cell threshold voltages. The shift can cause read disturbance error which can degrade memory device reliability.

A so-called "pass disturbance error" can affect memory cells on the same memory string during a programming operation to store data into a memory cell. During a programming operation, a word line of the memory cell is supplied with a bias voltage $V_{pgm}$ to program the ON/OFF status of the memory cell while other memory cells along a memory string are forced to be in the ON state since bias voltage $V_{pass}$ is applied to other word lines. Frequent applications of $V_{pass}$ to memory cells may unintentionally inject additional charges into charge-trapping layer and cause undesirable positive shifts of memory cell threshold voltages. The shifts can cause pass disturbance error which can degrade memory device reliability.

Another disturbance error is a so-called "program disturbance error" which can affect memory cells that are on the same word line during a programming operation to store data into a memory cell. During a programming operation, a word line of the memory cell is supplied with a bias voltage $V_{pgm}$ to program the ON/OFF status of the memory cell. Other memory cells along the same word line will be under the same $V_{pgm}$, which may cause undesirable positive shift of threshold voltages of other memory cells. The threshold voltage shift can lead to program disturbance error that negatively impacts the reliability of memory devices.

Embodiments of 3D NAND memory device and fabrication methods are described in the present disclosure. 3D NAND memory cells incorporating tunnel field effect transistor (TFET) can provide improved threshold voltage stability during 3D NAND memory device operations such as, reading, programming, and erasing.

FIG. 1 illustrates a 3D view of a memory device 100. Memory device 100 can include a vertical memory string and a horizontal alternating stack of word line 102 and insulating layer 104 formed over a substrate. The memory string can include vertical blocking layer 108, vertical charge-trapping layer 110, vertical tunneling layer 112, and vertical semiconductor channel 114. In some embodiments, a high-k (e.g., dielectric constant greater than 3.9) blocking layer 106 can be formed between word line 102 and insulating layer 104 and/or between word line 102 and vertical blocking layer 108. The memory string extends substantially through tiers of alternating word line 102 and insulating layer 104. Each intersection of a tier of word line and the memory string forms a memory cell (referred to herein as "memory cell"). In some embodiments, a plurality of memory cells are formed in series along a memory string. An ON or OFF state of a current along an intersected portion of semiconductor layer 104 represents the data stored in the memory cell. The ON or OFF state of a memory cell is determined by the threshold voltage of the memory cell. Threshold voltages can be controlled by trapped charges stored in an intersected portion of charge-trapping layer 110 and affected by a bias voltage applied at the corresponding word line.

In FIG. 1, semiconductor channel 114 is a ring-shaped layer with an outer surface 113 and an inner surface 115. Tunneling layer 112 is a ring-shaped layer surrounding semiconductor channel 114 where an inner surface of tunneling layer 112 is in contact with outer surface 113 of semiconductor channel 114. Similarly, charge-trapping layer 110 is a ring-shaped layer surrounding tunneling layer 112 and blocking layer 108 is a ring-shaped layer surrounding charge-trapping layer 110. A portion of an outer surface of blocking layer 108 is in contact with word line 102. In some embodiments, a high-k blocking layer 106 is disposed between word line 102 and blocking layer 108.

In some embodiments, the substrate can include any suitable material for forming the three-dimensional memory device. For example, the substrate can include silicon, silicon germanium, silicon carbide, silicon on insulator (SOI), germanium on insulator (GOI), glass, gallium nitride, gallium arsenide, III-V compound, glass, plastic sheet, any other suitable materials, and/or combinations thereof.

In some embodiments, tunneling layer 112 can include silicon oxide, silicon nitride, any suitable materials, and/or combinations thereof. In some embodiments, blocking layer 108 can include, but not limit to, silicon oxide, silicon nitride, high-k dielectrics (e.g., dielectric material with dielectric constant greater than 3.9), or any combinations thereof. In some embodiments, the charge-trapping layer 110 can include, but not limit to, silicon nitride, silicon oxynitride, or any combinations thereof. In some embodiments, high-k blocking layer 106 can include, but not limit to, aluminum oxide ($Al_2O_3$), hafnium oxide ($HfO_2$), tantalum oxide ($Ta_2O$), any suitable materials, and/or combinations thereof. In some embodiments, word line 102 can include, but not limit to, tungsten (W), cobalt (Co), copper (Cu), aluminum (Al), doped silicon, silicides, titanium nitride (TiN), tantalum nitride (TaN), any suitable materials, and/or combinations thereof. In some embodiments, insulating layer 104 can include, but not limit to, silicon oxide, silicon nitride, any suitable materials, and/or combinations thereof.

In some embodiments, insulating layer 104, blocking layer 108, charge-trapping layer 110, and tunneling layer 112 can be formed using deposition techniques including, but not limiting to, CVD, plasma-enhanced CVD (PECVD), low pressure CVD (LPCVD), physical vapor deposition (PVD), high density plasma (HDP), ALD, any suitable deposition techniques, and/or combinations thereof. In some embodiments, word line 102 can be formed using deposition techniques including, but not limiting to, CVD, ALD, sputtering, metal-organic chemical vapor phase deposition (MOCVD), any suitable deposition techniques, and/or combinations thereof.

Figure 2:
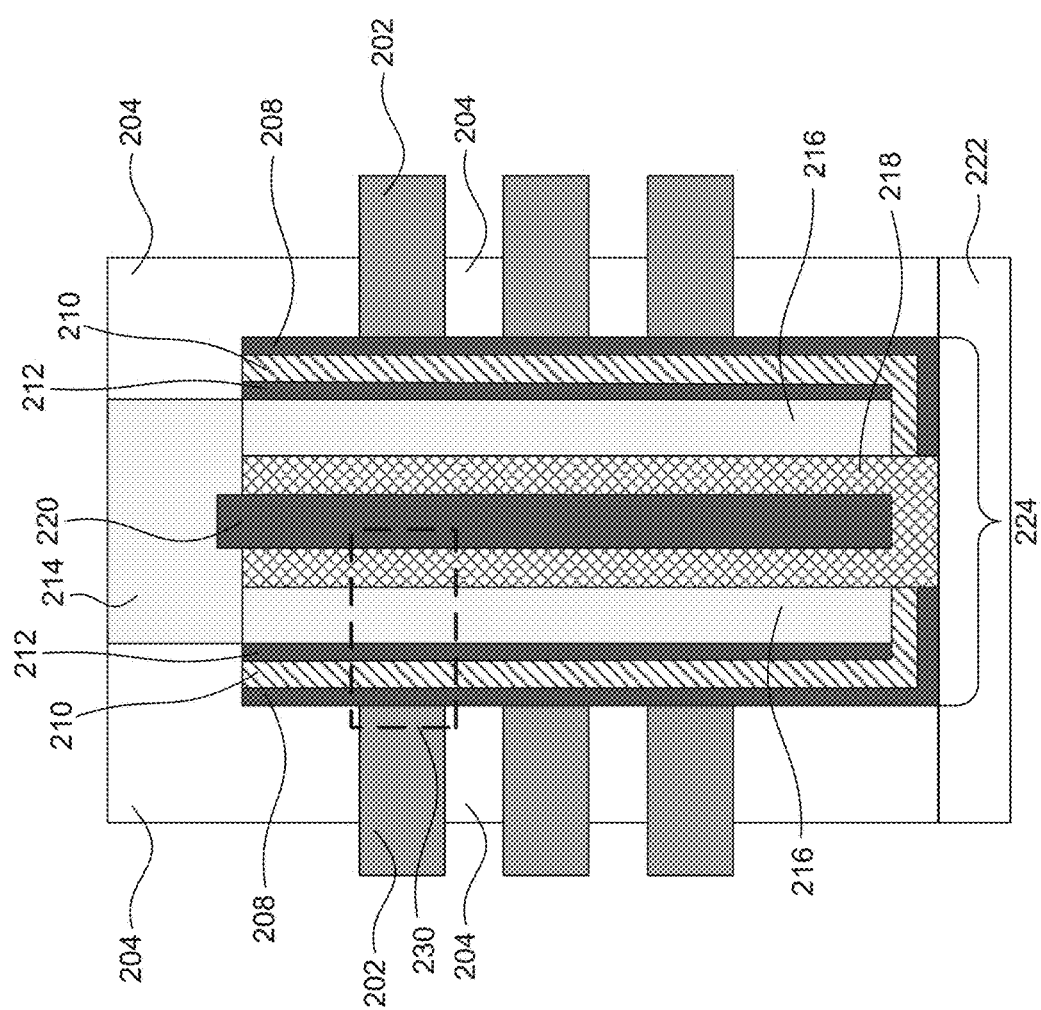
FIG. 2 illustrates a two-dimensional view of a memory device adopting tunneling field effect transistor structure, in accordance with some embodiments of the present disclosure.

FIG. 2 illustrates a two-dimensional view of memory device 200 incorporating tunneling field effect transistor (TFET) in a 3D NAND memory cell structure. Memory device 200 includes substrate region 222 on a substrate, an alternating stack of word line 202 and insulating layer 204 formed over substrate region 222, and hole 224 extending vertically through the alternating stack. Hole 224 can be filled with blocking layer 208, charge-trapping layer 210, tunneling layer 212, a semiconductor layer 216, and a semiconductor layer 218. In some embodiments, word line 202, insulating layer 204, blocking layer 208, charge-trapping layer 210, tunneling layer 212 can be made of similar materials as word line 102, insulating layer 104, blocking layer 108, charge-trapping layer 110, and tunneling layer 112, respectively. In some embodiments, the materials can respectively be different. Blocking layer 208 can be in contact with substrate region 222 and sidewalls of hole 224, and charge-trapping layer 210 can be formed over blocking layer 208. Tunneling layer 212 is in between charge-trapping layer 210 and semiconductor layer 216. Semiconductor layer 218 is at least in contact with substrate region 222 and semiconductor layer 216. Semiconductor layer 216 and semiconductor layer 218 form a TFET structure in place of semiconductor channel 114 as shown in FIG. 1. In some embodiments, an additional insulating layer 220 is disposed to contact inner surfaces of semiconductor layer 218. In some embodiments, a portion of outer surfaces of blocking layer 208 is in contact with word line 202. In some embodiments, semiconductor plug 214 is disposed over semiconductor layer 216 and semiconductor layer 218 and forms a contact to a bit line.

A semiconductor dopant can be an n-type dopant or a p-type dopant. In some embodiments, semiconductor layer 216 can be doped with one or more n-type dopants and both semiconductor layer 218 and substrate region 222 can be doped with one or more p-type dopants. In some embodiments, semiconductor layer 216 can be doped with one or more p-type dopants and both semiconductor layer 218 and substrate region 222 can be doped with one or more n-type dopants. In some embodiments, semiconductor plug 214 is doped with one or more either n-type or p-type dopants.

In some embodiments, semiconductor plug 214, semiconductor layer 216 or 218 can be formed of amorphous silicon, amorphous silicon-germanium, amorphous silicon carbide, polycrystalline silicon, polycrystalline silicon-germanium, polycrystalline silicon carbide, any suitable semiconductor material, and/or combinations thereof.

In some embodiments, the concentration of the one or more p-type dopants can range from about $1 \times 10^{16}$ atom/$cm^3$ to about $1 \times 10^{22}$ atom/$cm^3$. In some embodiments, the concentration can be greater than about $1 \times 10^{20}$ atom/$cm^3$. The p-type dopant can include any suitable dopant such as, for example, boron, aluminum, nitrogen, gallium, indium, and/or combinations thereof. In some embodiments, the concentration of the one or more of n-type dopants can range from about $1 \times 10^{16}$ atom/$cm^3$ to about $1 \times 10^{22}$ atom/$cm^3$. In some embodiments, the concentration can be greater than about $1 \times 10^{20}$ atom/$cm^3$. The n-type dopant can include any suitable dopants such as, for example, phosphorus, arsenic, antimony, bismuth, lithium, and/or combinations thereof.

When forming memory device 200, substrate region 222 can be patterned over the substrate with suitable photolithography processes and doped using suitable doping processes such as ion implantation or diffusion. The alternating stack of a sacrificial layer, formed of silicon nitride, and insulating layer 204 are deposited over the substrate including substrate region 222 using similar techniques as forming layer 102 and 104, and is not described in detail here for simplicity. Hole 224 can be etched through the alternating stack of word line 202 and insulating layer 204 using one or more etching processes to expose a first portion of substrate region 222. For example, the etching process can include RIE processes. Blocking layer 208 can be deposited conformally over sidewalls of hole 224 and on a portion of substrate region 222. Charge-trapping layer 210 can be deposited conformally over an inner sidewall and horizontal surfaces of deposited blocking layer 208. In some embodiments, deposition techniques for layers 208, 210, and 212 can be similar as those for layers 108, 110 and 112. Semiconductor layer 216 can be epitaxially grown over a surface of tunneling layer 212 using suitable deposition techniques including, but not limiting to, CVD, ALD, and MOCVD. A second portion of substrate region 222 is exposed by etching blocking layer 208, charge-trapping layer 210, tunneling layer 212 and semiconductor layer 216 with an anisotropic etching process such as RIE. Semiconductor layer 218 can be epitaxially grown over semiconductor layer 216 and the exposed second portion of substrate region 222 using similar techniques as forming layer 216. In some embodiments, the deposition techniques for depositing semiconductor layers 216 and 218 can be different. Semiconductor layers 216 and 218 can both be doped during their epitaxial growth (referred to as "in-situ doping"). In some embodiments, insulating layer 220 is deposited over an inner surface of semiconductor layer 218 using similar techniques as forming layers 208, 210 and 212. In some embodiments, semiconductor plug 214 can be grown using similar techniques as forming layer 216 and 218. Sacrificial layers of the alternating stack can be replaced with conductor layers to form word lines.

Figure 3:
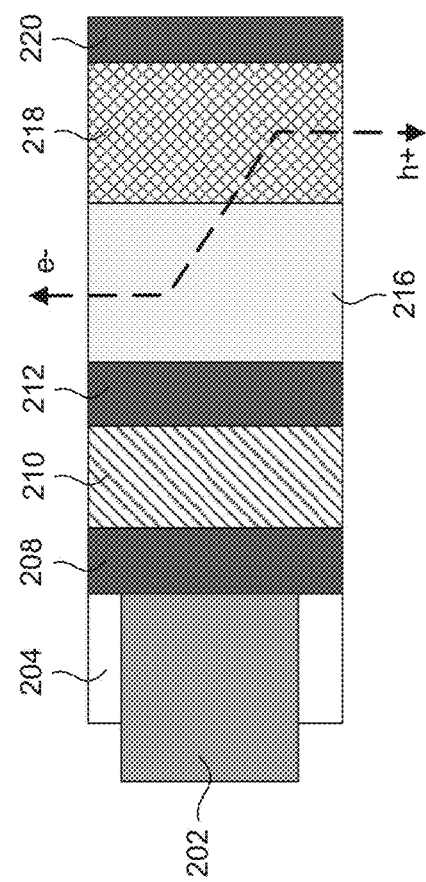
FIG. 3 illustrates a cross-sectional view of a memory cell, in accordance with some embodiments of the present disclosure.

Referring to FIG. 3, exemplary memory cell portion 300 is an enlarged view of highlighted box 230 of FIG. 2. Memory cell portion 300 incorporates a TFET structure to implement data storage, where the TFET structure includes semiconductor layer 216 and semiconductor layer 218. In some embodiments, semiconductor layer 216 and semiconductor layer 218 can be doped with n-type dopant and p-type dopants, respectively. In some embodiments, semiconductor layers 216 and semiconductor layer 218 can be doped with p-type dopant and n-type dopants, respectively. In a TFET structure, band-to-band tunneling effect is applied on a reverse bias PN junction to conduct electrical current. In memory cell portion 300, n-type semiconductor layer 216 can be reverse biased with respect to p-type semiconductor layer 218. When a positive bias voltage is applied at word line 202, a conduction band of semiconductor layer 216 can align with a valance band of semiconductor layer 218 which can enhance the tunneling of electrons/holes to conduct electrical current between semiconductor layer 216 and semiconductor layer 218 (e.g., memory cell 300 is ON). The degree of alignment between the conduction band and the valance band with respect to the positive bias at word line 202 can depend on the trapped charge stored at charge-trapping layer 210, and can be less affected by the operation status of any neighboring memory cells along the same memory string or same word line. Compared to a memory cell adopting a MOSFET structure, memory cell portion 300 incorporating TFET structure does not require any neighboring memory cells to be ON during operations of read, erase, and programming. It allows the overall memory device 200 to be much less affected by read disturbance and program disturbance, and therefore provides improved device reliability.

In an exemplary read operation, a first positive bias voltage can be applied at word line 202 of memory cell 300, while n-type second semiconductor layer 216 of memory cell 300 can be biased at a second positive bias voltage and p-type semiconductor layer 218 can be biased at ground level. Depending on the status of trapped charge in charge-tapping layer 210, a conducting of electrical current from n-type semiconductor layer 216 to p-type semiconductor layer 218 can happen within memory cell 300.

In an exemplary programming operation, a third positive bias voltage can be applied at word line 202 (e.g. about 20 volts) of memory cell 300 while n-type second semiconductor layer 216 of memory cell 300 can be biased at ground level. Semiconductor layers of other memory cells of other memory strings can be electrically floating. The bending of conduction and valance energy bands can be larger at memory cell 300 than that of the other memory cells. Therefore, only memory cell 300 can tunnel charges from n-type semiconductor layer 216, through tunneling layer 212, to charge-trapping layer 210.

In an exemplary erasing operation, a fourth positive bias voltage (e.g. about 20 volts) can be applied at n-type semiconductor layer 216 and a fifth positive bias voltage can be applied at p-type semiconductor layer 218 (e.g. about 20 volts) of memory cell 300 while word line 202 of memory cell 300 can be biased at ground level. Semiconductor layers of other memory cells of other memory strings can be electrically floating. The bending of conduction and valance energy bands can be larger at memory cell 300 than that of the other memory cells. Therefore, only memory cell 300 can tunnel charges from charge-trapping layer 210, through tunneling layer 212, to n-type semiconductor layer 216.

Figure 4:
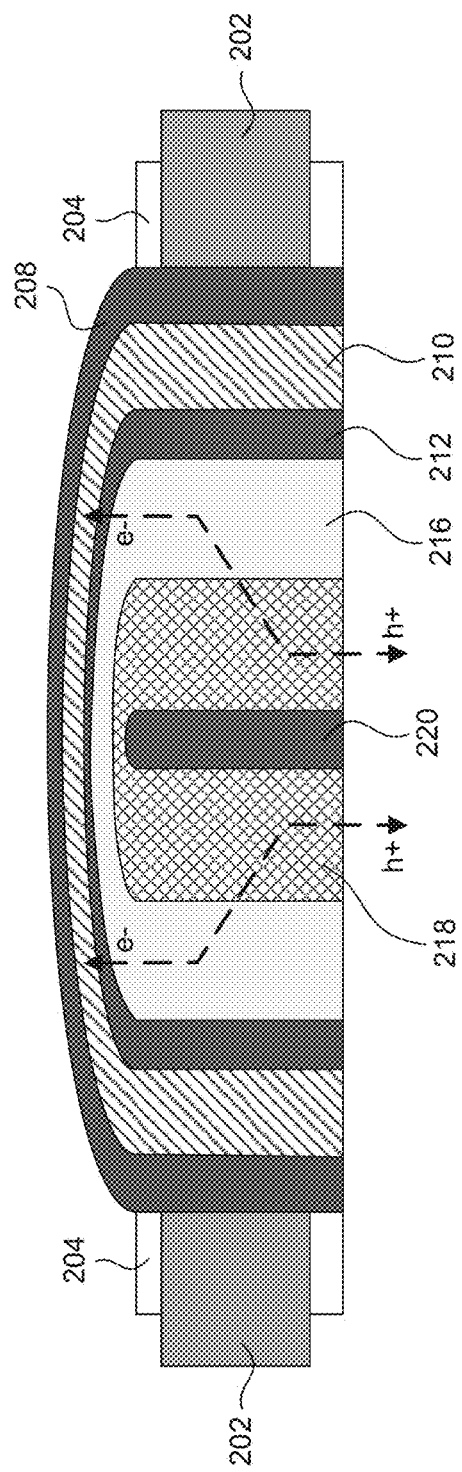
FIG. 4 illustrates a three-dimensional view of a memory cell, in accordance with some embodiments of the present disclosure.

FIG. 4 illustrates a three-dimensional view of memory cell portion 300. Blocking layer 208, charge-trapping layer 210, tunneling layer 212, semiconductor layer 216 and semiconductor layer 218 can be concentric ring (ring-shaped) structures. For example, as shown in FIG. 4, semiconductor layer 218 is surrounded by semiconductor layer 216, and sequentially surrounded by tunneling layer 212, charge-trapping layer 210, and blocking layer 208. In some embodiments, insulating layer 220 is in contact with inner surfaces of semiconductor layer 218. The TFET structure can include semiconductor layer 216 and semiconductor layer 218 and its conducting current can be determined by a first applied bias voltage at word line 202 and the charges stored in charge-trapping layer 208. The amount of charges stored in layer 208 can be determined by a second bias voltage at word line 202 during the programming operation of memory device 200. In some embodiments, the thickness of blocking layer 208 can be between about 1 nm and about 20 nm. For example, the thickness of blocking layer 208 can be about 5 nm. The thickness of charge-trapping layer 210 can be between about 1 nm and about 20 nm. For example, the thickness of charge-trapping layer 210 can be about 6 nm. The thickness of tunneling layer 212 can be between about 1 nm and about 10 nm. For example, the thickness of tunneling layer 212 can be about 4 nm. The thickness of semiconductor layer 216 or 218 can be between about 5 nm and about 30 nm. For example, the thickness of semiconductor layer 216 or semiconductor layer 218 can be about 10 nm.

Figure 5:
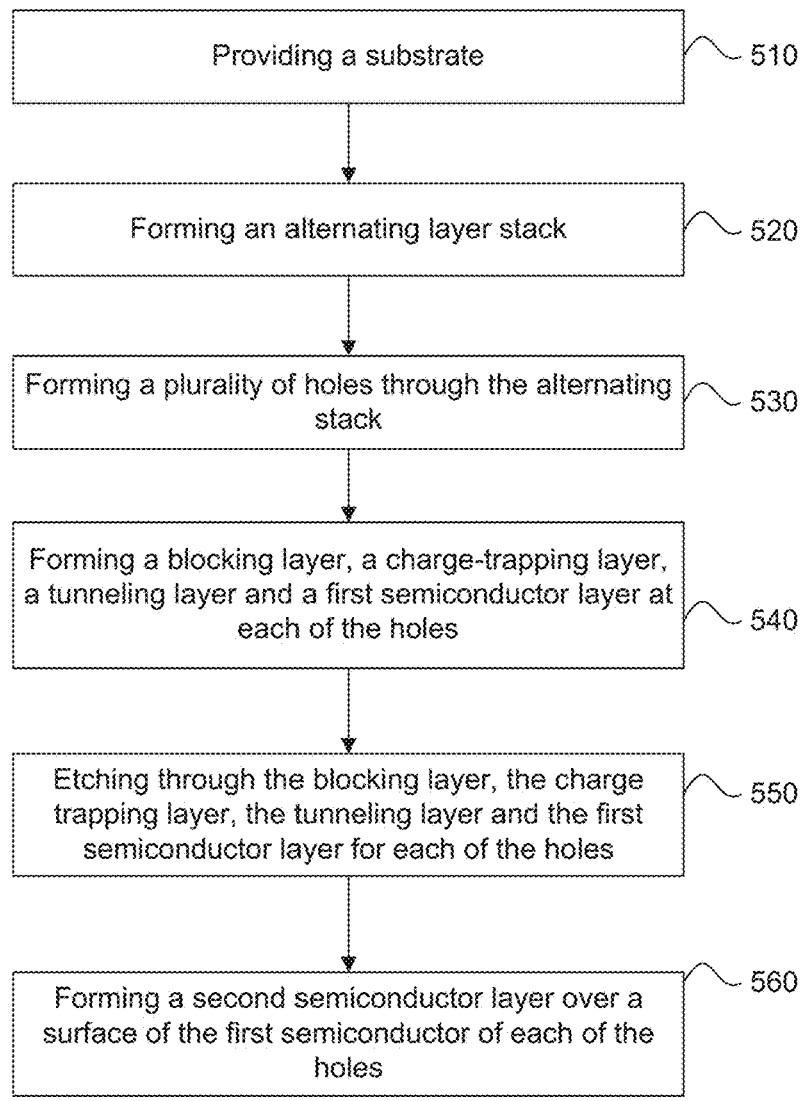
FIG. 5 illustrates an exemplary fabrication process for forming a three-dimensional memory structure, according to some embodiments, in accordance with some embodiments of the present disclosure.

FIG. 5 is a flowchart of an exemplary method 500 for forming a memory device, according to some embodiments. The operations of method 500 can be used to form memory device structures illustrated in FIGS. 2-4. It should be understood that the operations shown in method 500 are not exhaustive and that other operations can be performed as well before, after, or between any of the illustrated operations. In some embodiments, some operations of exemplary method 500 can be omitted or include other operations that are not described here for simplicity. In some embodiments, operations of method 500 can be performed in a different order and/or vary.

In operation 510, a substrate is provided to from the memory device. The substrate can include any suitable material for forming the three-dimensional memory structure. For example, the substrate can include silicon, silicon germanium, silicon carbide, SOI, GOI, glass, gallium nitride, gallium arsenide, plastic sheet and/or other suitable III-V compound. In some embodiments, a doped region is formed over the substrate using photolithography processes and ion implantation or diffusion. An example of the substrate can be substrate region 222 as described above in FIG. 2.

In operation 520, an alternating layer stack is deposited over the substrate. In some embodiments, the alternating layer stack can include an alternating insulating/sacrificial layer stack. In some embodiments, the alternating layer stack can include an alternating insulating/conductor layer stack. The sacrificial layer of the alternating layer stack can include materials such as silicon nitride or other suitable materials. The insulating layer of the alternating layer stack can include materials such as silicon oxide or other suitable materials. The conductor layer of the alternating layer stack can include materials such as tungsten or other suitable materials. Each of the insulating, sacrificial, and conductor layers of the alternating layer stack can include materials deposited by one or more thin film deposition processes including, but not limiting to, CVD, PVD, ALD, or any combinations thereof. An example of the alternating layer stack can be alternating layers 202 and 204 as described above in FIG. 2.

In operation 530, a plurality of holes are etched through the alternating layer stack. Each hole of the plurality of holes can be etched through the alternating layer stack using one or more etching processes such as an RIE process. Additionally, the etching process can etch through at least a portion of the alternating layer stack. In some embodiments, the holes expose a first portion of the substrate. In some embodiments, the holes are located at the doped region of the substrate. An example of the hole can be hole 224 as described above in FIG. 2.

In operation 540, a first semiconductor layer and a composite dielectric layer that extends vertically through the alternating layer stack are formed in each of the holes. The composite dielectric layer can be between the first semiconductor layer and the alternating dielectric stack. The composite dielectric layer can be a combination of multiple dielectric layers including, but not limiting to, a tunneling layer, a charge-trapping layer, and a blocking layer. The tunneling layer can include any suitable dielectric materials such as, silicon oxide, silicon nitride, silicon oxynitride, or any combinations thereof. The charge-trapping layer can include any materials suitable for storing charge for memory operation. The blocking layer can include any suitable dielectric materials such as silicon oxide or a combination of silicon oxide/silicon nitride/silicon oxide (ONO). The blocking layer can further include a high-k dielectric layer. Each layer above can be formed by processes such as ALD, CVD, PVD, any other suitable processes, or any combinations thereof. In some embodiments, the first semiconductor layer, the tunneling layer, the charge-trapping layer, and the blocking layer are ring-shaped (e.g., concentric rings) layers, where the first semiconductor is sequentially surrounded by the tunneling layer, the charge-trapping layer, and the blocking layer. An outer surface of the blocking layer can be in contact with the alternating layer stack. An example of the composite dielectric layer can include blocking layer 208, charge-trapping layer 210, and tunneling layer 212, while an example of the first semiconductor layer can be semiconductor layer 216, all described above in FIG. 2.

In operation 550, an anisotropic etching process is applied to remove a portion of the first semiconductor layer and the composite dielectric layer. The anisotropic etching process can include an RIE process. In some embodiments, the anisotropic etching process etches through the first semiconductor layer and the composite dielectric layer. In some embodiments, a second portion of the substrate is exposed at each of the holes after the anisotropic etching process.

In operation 560, a second semiconductor layer is filled in each of the holes. The second semiconductor layer is in contact with a surface of the first semiconductor and a bottom portion of the holes. In some embodiments, the second semiconductor layer is at least in contact with both the first semiconductor layer and the second portion of the exposed substrate at each holes. An example of the second semiconductor layer can semiconductor layer 218 as described above in FIG. 2.

In some embodiments, operation 560 further includes depositing an insulating material to cover an inner surface of the second semiconductor layer. The insulating material can be any suitable insulating material such as silicon oxide. The insulating material can be deposited by one or more thin film deposition processes such as CVD, PVD, ALD, or any combinations thereof. An example of the insulating material can be insulating layer 220 as described above in FIG. 2.

In some embodiments, a semiconductor plug is grown over semiconductor layer 216. The semiconductor plug may also be in contact with semiconductor layer 218. An example of the semiconductor plug can be semiconductor plug 214 as described above in FIG. 2.

The first semiconductor layer, the second semiconductor layers, and the semiconductor plug can be formed of any suitable materials. In some embodiments, the first semiconductor layer can be doped with p-type dopant and the second semiconductor layer can be doped with n-type dopant. In some embodiments, the first semiconductor layer can be doped with n-type dopant and the second semiconductor layer can be doped with p-type dopant. In some embodiments, the semiconductor plug can be doped with p-type or n-type dopant. In some embodiments, the p-type dopant can include boron, aluminum, nitrogen, gallium or indium. In some embodiments, the n-type dopant can include phosphorus, arsenic, antimony, bismuth, or lithium.

After operation 560, a memory string is formed within each of the holes. The memory string, including the first semiconductor layer, the second semiconductor layer, and the composite dielectric layer, extends vertically above the substrate through the alternating layer stack. The first semiconductor layer has different doping type (e.g., p-type or n-type) from that of the second semiconductor. The combination of the first and the second semiconductor layers forms a TFET structure. The composite dielectric layer can also include a tunneling layer, a charge-trapping layer, and a blocking layer. In addition, some dielectric layers of the alternating layer stack may be removed and replaced with conductor layers to form an alternating conductor/dielectric stack during, or after, operation 540-560. Each of the memory strings and the word lines (e.g., the conductor layers of the alternating conductor/dielectric stack) can form memory cells for storing data of 3D memory devices.

The present disclosure describes various embodiments of 3D memory device and methods of making the same. A plurality of vertical memory strings are embedded in an alternating layer stack (e.g. a repetition of the layer stack) disposed over a substrate. Each of the vertical memory strings can include a TFET channel layer and a composite dielectric layer. The TFET channel layer includes a first semiconductor layer having a first doping type and a second semiconductor layer having a second doping type opposite to the first doping type. Each intersection of the layer stack and a memory string is a memory cell, where the memory cell is a multi-level cell capable of storing at least four bits (e.g. Quad-Level-Cell (QLC)). When accessing a memory cell from a memory string, current can flow through other cells along the memory string (e.g., may not need to apply bias voltage on the other word lines). This characteristic significantly avoids the issue of read disturbance and pass disturbance and improve the overall reliability of the memory device.

In some embodiments, a 3D NAND memory cell is provided. The 3D NAND memory cell, disposed over a substrate, includes a vertical ring-shaped p-type semiconductor layer and a vertical ring-shaped n-type semiconductor layer, a vertical tunneling layer, a vertical charge-trapping layer, and a vertical blocking layer. The vertical ring-shaped p-type semiconductor layer is surrounded by the vertical ring-shaped n-type semiconductor layer, surrounded by the vertical tunneling layer, surrounded by the vertical charge-trapping layer, surrounded by the vertical blocking layer. An outer surface of the vertical blocking layer is in contact with conductive layer extending substantially parallel to a top surface of the substrate.

In some embodiments, a method for forming a 3D NAND memory string is provided. The method includes forming an alternating dielectric stack over a substrate. The method also includes etching a hole vertically through the alternating dielectric stack. In some embodiments, the hole exposes a portion of the substrate. The method further includes forming a blocking layer over sidewalls of the hole, a charge-trapping layer over the blocking layer, a tunneling layer over the charge-trapping layer, and a first semiconductor layer with a first doping type over the tunneling layer. The method also includes etching a portion of the first semiconductor layer, the charge-trapping layer, the tunneling layer and the blocking layer to expose a portion of the substrate. The method further forming a second semiconductor with a second doping type, wherein the second doping type is opposite to the first doping type, over the first semiconductor layer and the exposed portion of the substrate.

In some embodiments, a 3D NAND memory device is provided. The 3D NAND memory device, disposed over a doped region of a substrate, includes a plurality of 3D NAND memory strings and an alternating conductor/dielectric stack disposed over the substrate. Each of the 3D NAND memory strings, extending vertically above the substrate through the alternating conductor/dielectric stack, includes a first semiconductor layer surrounded by a second semiconductor layer, surrounded by a tunneling layer, surrounded by a charge-trapping layer, surrounded by a blocking layer. The first semiconductor layer has an opposite doping type (e.g. p-type or n-type) to the second semiconductor layer. In some embodiments, an insulating layer is disposed over an inner surface of the second semiconductor layer.

In some embodiments, a method for forming a 3D NAND memory device is provided. The method includes forming an alternated insulating/sacrificial layer stack over a substrate. The method also includes etching a plurality of holes vertical through the alternating insulating/sacrificial layer stack. The method also includes sequentially filling a composite dielectric layer and a first semiconductor layer with a first doping type into each hole. The method further includes removing a portion of the composite dielectric layer and the first semiconductor layer to expose a portion of the substrate within each of the holes. The method also includes filling a second semiconductor with a doping type opposite to the first doping type into each of the holes.

In some embodiments, a 3D NAND memory device is provided. The 3D NAND memory device includes a substrate and a plurality of 3D NAND memory strings. Each of the 3D NAND memory strings includes a structure of tunnel field effect transistor. The structure of tunnel field effect transistor includes a first semiconductor layer doped with one or more p-type dopants that extends substantially perpendicular to a top surface of the substrate. The structure of tunnel field effect transistor also includes a second semiconductor layer that is doped with one or more n-type dopants. The second semiconductor layer extends substantially perpendicular to a top surface of the substrate and is also in contact with the first semiconductor layer. The 3D NAND memory device further includes an alternating conductor/dielectric stack disposed over the substrate. An intersection of each conductor/dielectric stack of the alternating conductor/dielectric stack with a 3D NAND memory string of the plurality of 3D NAND memory strings forms a memory cell.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:
1. A 3D NAND memory cell, comprising:
a substrate;

a vertical ring-shaped p-type semiconductor layer disposed over the substrate;
a vertical n-type semiconductor layer surrounding the vertical ring-shaped p-type semiconductor layer;
a semiconductor plug disposed over the vertical ring-shaped p-type semiconductor layer and the vertical n-type semiconductor layer; and
a plurality of vertical dielectric layers surrounding the vertical n-type semiconductor layer, wherein:
  a vertical dielectric layer of the plurality of vertical dielectric layers is entirely separated from the vertical ring-shaped p-type semiconductor layer; and
  another vertical dielectric layer of the plurality of vertical dielectric layers is in contact with the vertical ring-shaped p-type semiconductor layer.

2. The 3D NAND memory cell of claim 1, further comprising an insulating layer surrounded by the vertical ring-shaped p-type semiconductor layer.

3. The 3D NAND memory cell of claim 2, wherein a top of the insulating layer is above a top of the vertical ring-shaped p-type semiconductor layer and a top of the vertical n-type semiconductor layer.

4. The 3D NAND memory cell of claim 1, wherein the plurality of vertical dielectric layers comprise a tunneling layer, a charge-trapping layer, and a blocking layer.

5. The 3D NAND memory cell of claim 4, wherein the tunneling layer surrounds the vertical n-type semiconductor layer, the charge-trapping layer surrounds the tunneling layer, and the blocking layer surrounds the charge-trapping layer.

6. The 3D NAND memory cell of claim 4, wherein the charge-trapping layer comprises silicon nitride.

7. The 3D NAND memory cell of claim 4, wherein the blocking layer comprises silicon oxide or high-k material.

8. The 3D NAND memory cell of claim 1, wherein each of the vertical n-type semiconductor layer, the vertical ring-shaped p-type semiconductor layer, and the semiconductor plug comprises silicon, silicon germanium or silicon carbide.

9. The 3D NAND memory cell of claim 1, wherein the semiconductor plug comprises another n-type semiconductor layer.

10. The 3D NAND memory cell of claim 1, wherein the substrate comprises a planar semiconductor region, wherein a bottom of the vertical ring-shaped p-type semiconductor layer and another bottom of the plurality of vertical dielectric layers are substantially coplanar with a top of the planar semiconductor region.

11. A method for forming a 3D NAND memory string, comprising:
  forming an alternating dielectric stack over a substrate;
  forming a hole through the alternating dielectric stack;
  disposing a plurality of dielectric layers over sidewalls of the hole;
  disposing an n-type semiconductor layer in contact with the dielectric layers;
  removing a portion of the dielectric layers and the n-type semiconductor layer;
  disposing a p-type semiconductor layer in contact with the n-type semiconductor layer and a dielectric layer of the plurality dielectric layers, wherein the p-type semiconductor layer is entirely separated from another dielectric layer of the plurality of dielectric layers; and
  forming a semiconductor plug over the p-type semiconductor layer and the n-type semiconductor layer.

12. The method of claim 11, further comprising forming an insulating layer surrounded by the p-type semiconductor layer and under the semiconductor plug.

13. A 3D NAND memory device, comprising:
  a substrate having a substrate region doped with a first type of dopant;
  a plurality of 3D NAND memory strings, wherein each of the 3D NAND memory strings comprises:
    a first semiconductor layer doped with the first type of dopant extending substantially perpendicular to a top surface of the substrate;
    a second semiconductor layer doped with a second type of dopant surrounding the first semiconductor layer, wherein the second type of dopant is different from the first type of dopant;
    a plurality of ring-shaped dielectric layers surrounding the second semiconductor layer, wherein a ring-shaped dielectric layer of the plurality of ring-shaped dielectric layers is in contact with the first semiconductor layer, and another ring-shaped dielectric layer of the plurality of ring-shaped dielectric layers is entirely separated from the first semiconductor layer; and
    a semiconductor plug over the first semiconductor layer and the second semiconductor layer; and
  an alternating conductor/dielectric stack disposed over the substrate region, wherein each conductor/dielectric stack of the alternating conductor/dielectric stack contacts a portion of the plurality of 3D NAND memory strings.

14. The 3D NAND memory device of claim 13, wherein each of the 3D NAND memory strings further comprises an insulating layer surrounded by the first semiconductor layer.

15. The 3D NAND memory device of claim 13, wherein each of the 3D NAND memory strings extend vertically above the substrate and through the alternating conductor/dielectric stack.

16. The 3D NAND memory device of claim 13, wherein the plurality of ring-shaped dielectric layers comprise a tunneling layer surrounding the second semiconductor layer, a charge-trapping layer surrounding the tunneling layer, and a blocking layer surrounding the charge-trapping layer.

17. The 3D NAND memory device of claim 13, wherein the semiconductor plug is doped with the first type of dopant.

18. The 3D NAND memory device of claim 13, wherein the substrate region comprises a planar surface, and wherein the first semiconductor layer and the plurality of ring-shaped dielectric layers physically contact the planar surface.

19. The 3D NAND memory device of claim 13, wherein a top of the alternating conductor/dielectric stack is above another top of the plurality of ring-shaped dielectric layers.

20. The 3D NAND memory device of claim 13, wherein the semiconductor plug is doped with the second type of dopant.

* * * * *